United States Patent
Reuber

(12) 
(10) Patent No.: US 11,062,867 B2
(45) Date of Patent: Jul. 13, 2021

(54) ACTUATOR FOR A MEDIUM VOLTAGE CIRCUIT BREAKER

(71) Applicant: ABB SCHWEIZ AG, Baden (CH)

(72) Inventor: Christian Reuber, Willich (DE)

(73) Assignee: ABB SCHWEIZ AG, Baden (CH)

( * ) Notice: Subject to any disclaimer, the term of this patent is extended or adjusted under 35 U.S.C. 154(b) by 164 days.

(21) Appl. No.: 16/244,131

(22) Filed: Jan. 10, 2019

(65) Prior Publication Data

US 2019/0148093 A1 May 16, 2019

Related U.S. Application Data

(63) Continuation of application No. PCT/EP2017/067634, filed on Jul. 12, 2017.

(30) Foreign Application Priority Data

Jul. 12, 2016 (EP) .................................... 16179127

(51) Int. Cl.
*H01H 47/00* (2006.01)
*H01H 71/10* (2006.01)
(Continued)

(52) U.S. Cl.
CPC ....... *H01H 47/002* (2013.01); *G01R 31/3272* (2013.01); *H01H 3/32* (2013.01); *H01H 11/0062* (2013.01); *H01H 50/18* (2013.01); *H01H 50/44* (2013.01); *H01H 50/56* (2013.01); *H01H 50/641* (2013.01);
(Continued)

(58) Field of Classification Search
CPC .... H01H 47/002; H01H 11/0062; H01H 3/32; H01H 50/18; H01H 50/44; H01H 50/56; H01H 50/641; H01H 71/10; H01H 2009/566; H01H 33/666; H01H 2071/048; H01H 2047/009; H01H 2003/268; H01H 2235/01; H01H 3/28; H01H 77/06; G01R 31/3272; H01F 2007/185

See application file for complete search history.

(56) References Cited

U.S. PATENT DOCUMENTS 6,009,615 A   1/2000  McKean et al.
8,912,871 B2  12/2014 Lauraire et al.
(Continued)

FOREIGN PATENT DOCUMENTS

CN    1190487 A    8/1998
CN    104051195 A  9/2014
(Continued)

*Primary Examiner* — Mohamad A Musleh
(74) *Attorney, Agent, or Firm* — Leydig, Voit & Mayer, Ltd.

(57) ABSTRACT

An actuator for a medium voltage circuit breaker or recloser includes: at least one movable contact with a contact stem, driven by an electromagnetic drive or a motor drive; and a spring, the spring being positioned in a kinematic chain between the drive and the at least one movable contact or contact stem. An arrangement of the at least one movable contact and the electromagnetic drive or motor drive is coupled to a detection unit for detecting a micromotion activation in order to register an actual movability and availability of the electromagnetic drive or motor drive of the at least one movable contact without changing an actual switch position itself.

11 Claims, 4 Drawing Sheets

(51) Int. Cl.
*H01H 11/00* (2006.01)
*G01R 31/327* (2006.01)
*H01H 3/32* (2006.01)
*H01H 50/18* (2006.01)
*H01H 50/44* (2006.01)
*H01H 50/56* (2006.01)
*H01H 50/64* (2006.01)
*H01H 9/56* (2006.01)
*H01H 33/666* (2006.01)
*H01F 7/18* (2006.01)
*H01H 71/04* (2006.01)
*H01H 3/26* (2006.01)

(52) U.S. Cl.
CPC ....... H01H 71/10 (2013.01); *H01F 2007/185* (2013.01); *H01H 33/666* (2013.01); *H01H 2003/268* (2013.01); *H01H 2009/566* (2013.01); *H01H 2047/009* (2013.01); *H01H 2071/048* (2013.01); *H01H 2235/01* (2013.01)

(56) References Cited

U.S. PATENT DOCUMENTS

| | | |
|---|---|---|
| 10,347,440 B2 | 7/2019 | Kinsella et al. |
| 2009/0138212 A1* | 5/2009 | Maruyama ............ H01F 7/1844 702/34 |
| 2011/0234210 A1 | 9/2011 | Hayashi et al. |
| 2013/0335174 A1* | 12/2013 | Kodama ............... H01H 50/541 335/2 |
| 2013/0342292 A1* | 12/2013 | Choi ....................... H01H 50/00 335/192 |
| 2014/0090965 A1 | 4/2014 | Leccia et al. |
| 2016/0134205 A1 | 5/2016 | Bock et al. |
| 2016/0358732 A1* | 12/2016 | Nishio ................. H01H 47/002 |
| 2018/0005743 A1* | 1/2018 | Plucinski ............ F16K 31/0668 |
| 2018/0277324 A1* | 9/2018 | Kobayashi ............. H01H 50/56 |
| 2018/0308650 A1* | 10/2018 | Koch ................... H01H 47/002 |
| 2019/0019643 A1* | 1/2019 | Bobert ............... H01H 36/0013 |

FOREIGN PATENT DOCUMENTS

| | | |
|---|---|---|
| CN | 104685593 A | 6/2015 |
| CN | 105589009 A | 5/2016 |
| EP | 0721650 A1 | 7/1996 |
| EP | 2779194 A1 | 9/2014 |
| EP | 2814044 A1 | 12/2014 |
| EP | 3018678 A1 | 5/2016 |
| GB | 2275541 A | 8/1994 |
| JP | 5488103 B2 | 5/2014 |
| RU | 2402096 C1 | 10/2010 |
| RU | 2529884 C2 | 10/2014 |

* cited by examiner

ACTUATOR FOR A MEDIUM VOLTAGE CIRCUIT BREAKER

CROSS-REFERENCE TO PRIOR APPLICATION

This application is a continuation of International Patent Application No. PCT/EP2017/067634, filed on Jul. 12, 2017, which claims priority to European Patent Application No. EP 16179127.2, filed on Jul. 12, 2016. The entire disclosure of both applications is hereby incorporated by reference herein.

FIELD

The invention relates to an actuator for a medium voltage circuit breaker or recloser with at least one movable contact with a contact stem, driven by an electromagnetic drive or a motor drive, and a spring, wherein the spring is positioned in the kinematic chain between the drive and the movable contact or contact stem.

BACKGROUND

In general, for circuit breakers or reclosers, but especially for safety relevant applications, it is desirable to ensure that the circuit breaker or recloser would really operate when a signal command, either for closing or for opening, is given. What is being done usually with circuit breakers is a coil supervision—here, a small test current is running through the release coils to make sure, that there is no interruption in the current path (broken coil wire, broken cable, loose connector, . . . ). Then the operator can be sure, that a real command would energise the release coil of the drive of the circuit breaker or recloser, but there is no evidence that the drive would really move. There can be further failures between the release coil and the main shaft like loose screws or increased friction.

SUMMARY

In an embodiment, the present invention provides an actuator for a medium voltage circuit breaker or recloser, comprising: at least one movable contact with a contact stem, driven by an electromagnetic drive or a motor drive; and a spring, the spring being positioned in a kinematic chain between the drive and the at least one movable contact or contact stem, wherein an arrangement of the at least one movable contact and the electromagnetic drive or motor drive is coupled to a detection unit configured to detect a micromotion activation in order to register an actual movability and availability of the electromagnetic drive or motor drive of the at least one movable contact without changing an actual switch position itself.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 4 shows the curves of a strategy for a mircomotion in ON.

DETAILED DESCRIPTION

Figure 1:
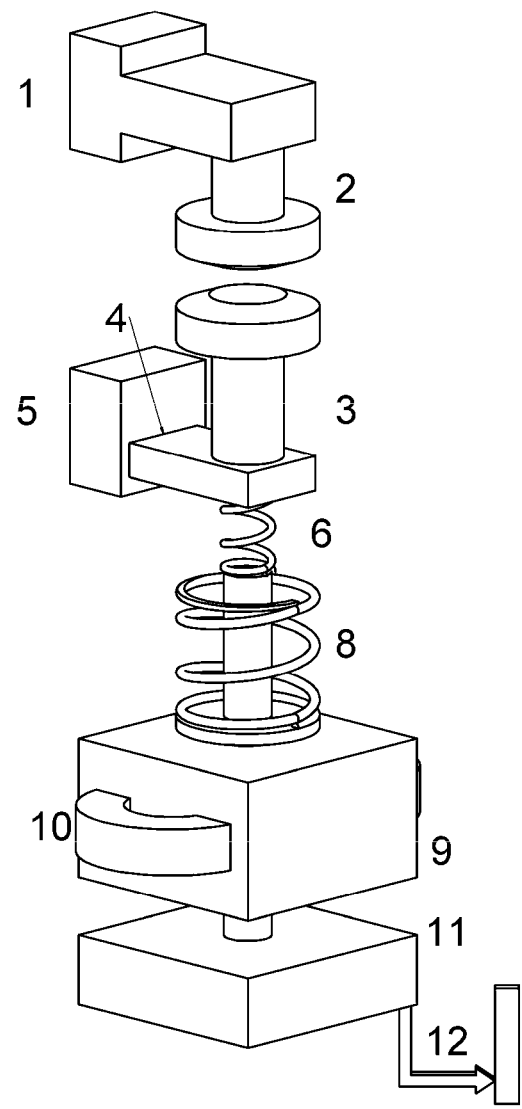
FIG. 1 shows a medium voltage circuit breaker or recloser pole in an open position.
Figure 2:
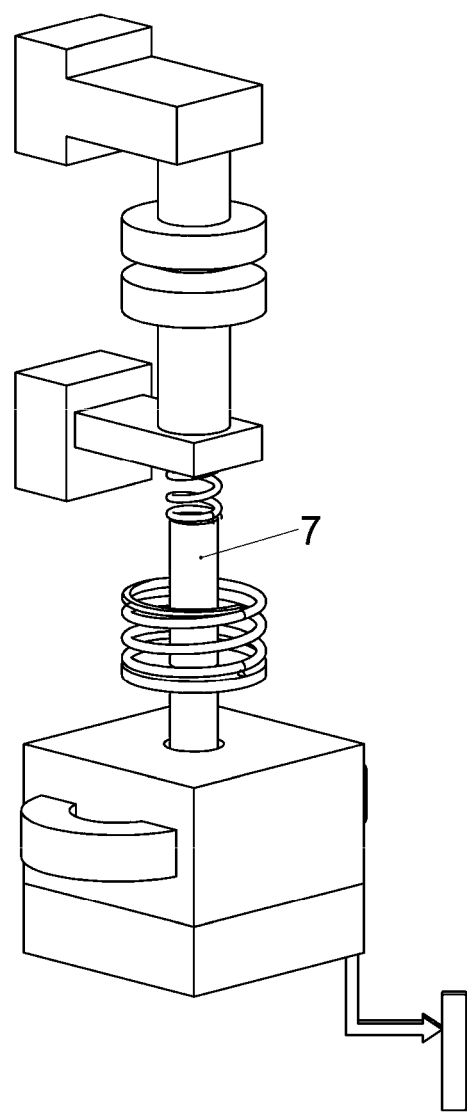
FIG. 2 shows a medium voltage circuit breaker or recloser pole in a closed position.

In an embodiment, an object of the invention is to get a qualified actual status signal about functional availability of the drive.

The invention is, that the arrangement of movable contact and movable contact drive is furthermore coupled to a detection unit for the detection of a micromotion activation and with means for feedback control of a micromotion activation, in order to register the actual movability and availability of the drive of the movable contact, without changing the actual switch position itself.

The detection unit for the detection of a micromotion activation can be e.g. a sliding resistor or any other position measuring device. Alternatively, also an acceleration sensor can be used to detect the micromotion.

Alternatively, also an acoustic sensor can be used to detect the characteristic noise that occurs when the actuator comes back to its original position after the micromotion. Sensors like the acoustic sensor and the acceleration sensor do not have to be directly coupled to the drive or to the kinematic chain. The characteristic effect of the noise or of the vibration due to the micromotion can be detected anywhere inside the circuit breaker or recloser.

Alternatively, the back e.m.f of the actuator can be used instead of a separate sensor. The back e.m.f. is a voltage that is measurable at the terminals of the actuator coil. This voltage depends on the change of flux in the coil of the actuator due to the change of the current and the change of the position.

Many designs of circuit breakers and reclosers foresee one drive for more that one contact. Often there three contacts for three phase AC systems. The invention also works with and relates to these designs.

The basical idea is, to execute a small physical motion of the drive of the circuit breaker, to ensure that the drive is moveable and not blocked.

As the position of the circuit breaker—OFF (open) or ON (closed)—shall basically not be modified by this test, this motion has to be relatively small, compared to the nominal stroke of the drive. Because of that, the terminology "micromotion" is used. The motion of the drive shall not be more than a few mm away from the ON or OFF position.

When the circuit breaker or recloser is in OFF position, also the moveable contact of for example a vacuum interrupter will follow this small motion. The contact distance will be reduced accordingly for a short time, which will be in the range of a few milliseconds. As this motion will be small, compared to the nominal contact distance in OFF position, the insulating properties of the vacuum interrupter will not be significantly reduced. A small motion in the range of 1 mm can be compared with the backtravel motion, that can occur anyway in circuit breakers or reclosers at the end of the opening operation.

Due to lever ratios, mechanical loose and deflection, the travel of the drive and the travel of the contact or contacts can be different. Important is to limit the motion of the contact or contacts from the OFF position in a way to avoid dielectric problems. It is recommended to confirm with dielectric typetesting that the insulation levels for the circuit breaker or contactor are also valid when the contact or contacts are about 1 mm away from the OFF position.

When the circuit breaker or recloser is in ON position, the drive presses a contact spring against the movable contact of a vacuum interrupter and charges the contact spring by typically several mm. A small micromotion will therefore be compensated by an elongation of the contact spring, so that the movable contact will not move during the test. Explicitly, the contacts will not open during the test. The elongation of the contact spring or contact springs shall be distinctly smaller than the regular contact spring travel of the circuit breaker or recloser to ensure that the contact or contacts remain closed with sufficient contact force. Also here, a travel of about 1 mm is proposed.

In a further advantageous embodiment, the aforesaid feedback control of the micromotion activation is implemented in a signal device. By that, the functionality can be implemented also in retrofit, if the circuit breaker is already applied with the aforesaid contact spring.

In a further advantageous embodiment, the micromotion amplitude is round about 1 mm at the contact in OFF and at the contact spring in ON.

In a further advantageous embodiment, it is proposed, that between the stem of the movable contact and the pushrod is arranged an axial contact spring.

This was already functionally described in the aforesaid advantages.

In a further advantageous embodiment, it is proposed, that in the same effective axial direction of the pushrod is arranged an opening spring.

In a further advantageous embodiment, it is proposed, that a position sensor is mechanically linked to a movable part of the drive. So by that, the sensor placement is easier, than to place it near the contacts, or at the contact stem directly.

In a further advantageous embodiment, it is proposed, that an acceleration sensor is placed somewhere inside the circuit breaker or recloser.

In a further advantageous embodiment, it is proposed to evaluate the back e.m.f. of the actuator to detect the micromotion of the drive. This can be calculated in the signal device that drives the micromotion procedure at no extra costs. A separate sensor can then be saved.

A mathematical model of the actuator or motor consists mainly of a resistor, an inductor and a back e.m.f. voltage. This circuit is in general connected to a voltage source to drive a current. When the model is known, including the dependencies of the parameters mainly on the current and the position of the drive, the back e.m.f. can be detected by a comparison of the voltage source and the current and its derivatives with respect to time.

According to a method for operating an actuator for a medium voltage circuit breaker with at least one movable contact with a contact stem, driven by a contact electromagnetic drive or a motor drive, and a spring, wherein the spring is positioned in the kinematic chain between the drive and the movable contact or contact stem, the invention is, that in order to register the actual movability and availability of the drive of the movable contact, without changing the actual switch position itself, the drive is charged with a micro actuation signal.

A medium voltage circuit breaker or recloser pole, that is considered here, shall have the following structure, as shown in the FIGS. 1 (open) and 2 (closed) as an example:

In the OFF position of the circuit breaker or recloser, see FIG. 1, the concept of the micromotion can be realised relatively easy. The coil is energised in a similar way, as for a standard closing operation. As soon as the begin of the motion of the drive is detected, the current is controlled to zero and the drive will go back to the open position, driven by the opening spring(s).

In a further advantageous embodiment of the method, is, that for the micromotion in OFF, only the closing coil of the two-coil actuator is used, wherein at first the two coil actuator is energised with positive current, and then the coil will be energised with negative current to keep the movable part of the drive in the OFF position or to return it to the OFF position.

A further advantageous embodiment if, that for the micromotion in ON, only the closing coil of the two-coil actuator is used, the latch of the drive in ON is at first released by a small negative current in the closing coil, and then the latch is re-established by a strong positive current.

Figure 3:
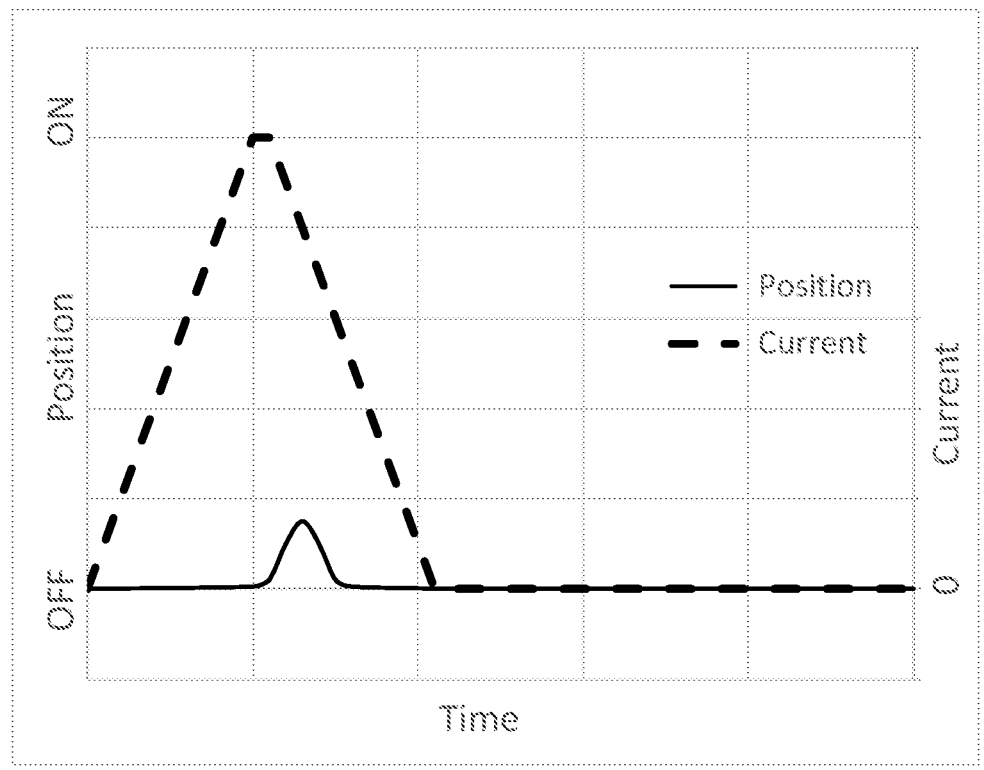
FIG. 3 shows the general curves of coil current and drive position over time.

FIG. 3 shows the general curves of coil current and drive position over time. The current starts to increase from 0 to a certain value, e.g. by connection of the coil to a supply voltage. The position of the drive is the OFF position. In case the current reaches a certain predefined level before motion starts, the current can be kept constant, e.g. using a current controller with pulse width modulation (PWM). After a certain time, the drive will start to move from OFF towards the ON position. The current is now reduced e.g. by reversing the driving voltage. Due to the inertia of the motion and the still existing driving force the drive will continue its motion towards the ON position for some time, but as current decreases, and supported by the force of the opening spring(s), the drive will return to the OFF position.

The micromotion cycle in OFF is now completed; there is evidence that the drive is movable.

The general design of a medium voltage circuit breaker or recloser with vacuum interrupters includes relatively strong contact springs 6 between the drive and the movable contact of the vacuum interrupter. These springs support the opening operation in the beginning. Further, additional opening springs 8 can be installed to support the entire opening operation. The magnetic latching force of the actuator will however become strongly lower as soon as a motion occurs, i.e. when the moveable part of the drive 11 moves away from the fixed part of the drive 9. The risk for the mircomotion in ON is, that these springs can bring the drive in a situation, where the opening forces (contact springs plus opening springs) are higher than the closing force of the magnetic actuator. The result could be, that the motion is larger than desired, it can not be limited to be small. Therefore, the strategy for a mircomotion in ON can be different.

Figure 4:
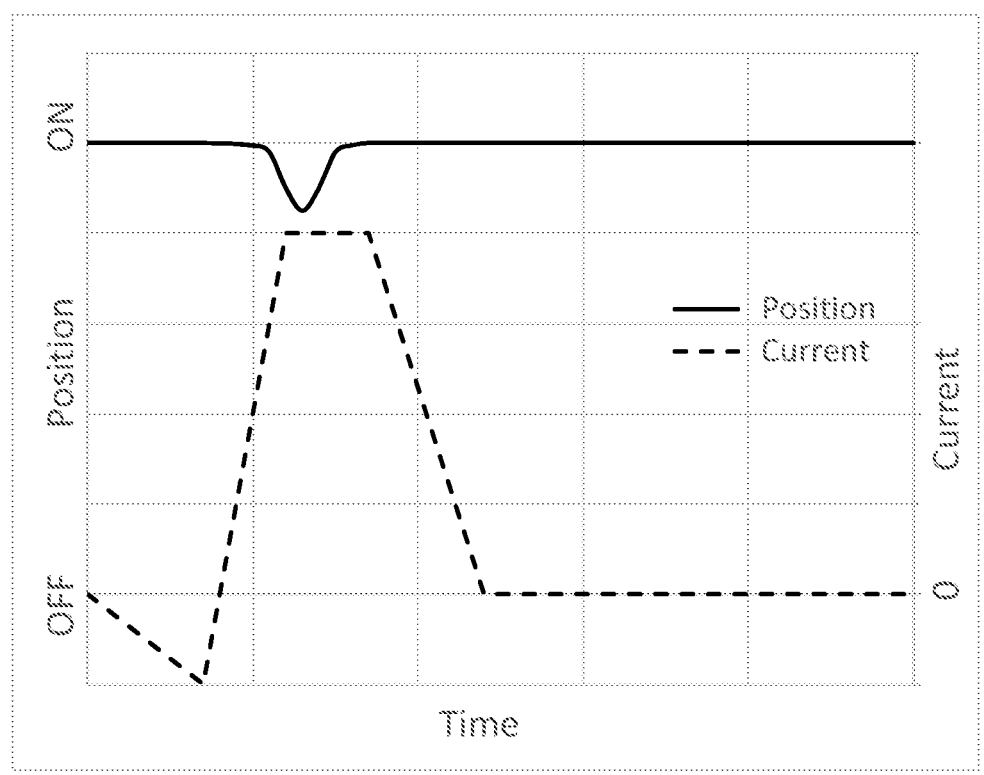

FIG. 4 shows the curves of this different strategy. The current is negative in the first period, as a negative current is used in magnetic actuators with one coil to reduce the magnetic holding force and so to initiate the opening operation, that is then mainly driven by the contact spring and the opening spring. Depending on the actual forces of all involved parts of the drive it can be that the motion of the drive is not a real micromotion, it could be larger than the defined target, e.g. larger than 1 mm. To avoid this large motion the proposed strategy is to reverse the direction of current before the motion is detectable. This will generate sufficient latching force to make sure that the motion is not larger than the defined target.

It can now be the case that the reverse of the current is so early, that a motion does not occur at all. In that case, the controller shall repeat the test with a slightly later reverse of the current or with a slightly stronger driving voltage or current. The procedure can be repeated until a micromotion could be noticed or until a defined current- or drive voltage- or feeding time-threshold was reached that indicates that the drive has a failure if it does not move with this threshold current or threshold voltage of threshold feeding time.

This principle can also be used for the micromotion in OFF to realise smaller motions. Depending on the actual design of the magnetic drive it can also be necessary to use this principle for mircomotion in OFF.

The test with the micromotion shall be repeated on a regular basis, e.g. once an hour or once a day.

These principles can also be used for two-coil actuators, as shown e.g. in EP0721650. Instead of positive and negative currents in one coil, the current in the closing coil and the current in the opening coil can be used to obtain the desired motion of the drive.

In another advantageous embodiment, for the micromotion in OFF, only the closing coil of the two-coil actuator is used. It is at first energised with positive current. Then the coil shall be energised with negative current to keep the movable part of the drive in the OFF position or to return it to the OFF position.

In another advantageous embodiment, for the micromotion in ON, only the closing coil of the two-coil actuator is used. The latch of the drive in ON is at first released by a small negative current in the closing coil. Then the latch is re-established by a strong positive current. This is quite similar to the procedure with one-coil actuators.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

NUMBERING

1 Upper electrical terminal
2 Fixed switching contact
3 Movable switching contact
4 Electrical contact, sliding or flexible conductor
5 Lower electrical terminal
6 Contact spring
7 Pushrod
8 Opening spring; upper end is fixed
9 Fixed part of drive
10 Coil of drive
11 Movable part of drive
12 Position sensor

What is claimed is:

1. An actuator for a medium voltage circuit breaker or recloser, comprising:
    at least one movable contact with a contact stem, driven by an electromagnetic drive or a motor drive; and
    a spring, the spring being positioned in a kinematic chain between the drive and the at least one movable contact or contact stem,
    wherein in a first nominal stroke the at least one movable contact is configured to move to an open position from a closed position,
    wherein in a second nominal stroke the at least one movable contact is configured to move to the closed position from the open position,
    wherein in the closed position the electromagnetic drive or motor drive is configured to activate a first micromotion such that the at least one movable contact is configured to move from the closed position back to the closed position without moving to the open position,
    wherein in the open position the electromagnetic drive or motor drive is configured to activate a second micromotion such that the at least one movable contact is configured to move from the open position back to the open position without moving to the closed position, and
    wherein the actuator further comprises at least one sensor configured to detect the first micromotion and the second micromotion, the at least one sensor comprising a position sensor, an acceleration sensor, an acoustic sensor, or a back e.m.f. sensor.

2. The actuator according to claim 1, wherein a micromotion amplitude is round about 1 mm at the at least one movable contact in the open position and at the contact spring in the closed position.

3. The actuator according to claim 1, further comprising an axial contact spring arranged between the stem of the at least one movable contact and a pushrod.

4. The actuator according to claim 3, wherein an opening spring is arranged in a same effective axial direction of the pushrod.

5. The actuator according to claim 1, wherein the at least one sensor comprises the position sensor, and
    wherein the position sensor is mechanically linked to a movable part of the electromagnetic drive or motor drive to detect the micromotion.

6. The actuator according to claim 1, wherein the at least one sensor comprises the acceleration sensor, and
    wherein the acceleration sensor is coupled to the electromagnetic drive or motor drive by placing the acceleration sensor inside of or closely to the circuit breaker or recloser to detect the micromotion.

7. The actuator according to claim 1, wherein the at least one sensor comprises the back e.m.f. sensor configured to detect a back e.m.f., of the electromagnetic drive or motor drive, and
    wherein the back e.m.f. of the electromagnetic drive or motor drive is evaluated to detect the micromotion.

8. The actuator according to claim 1, wherein activation of the first micromotion is configured to move the at least one movable contact less than several mm from the closed position, and activation of the second micromotion is configured to move the at least one movable contact less than several mm from the closed position.

9. A method for operating an actuator for a medium voltage circuit breaker with at least one movable contact with a contact stem, driven by a contact electromagnetic drive or a motor drive, and a spring, wherein the spring is positioned in a kinematic chain between the drive and the at least one movable contact or contact stem, wherein, in a first nominal stroke the at least one movable contact is configured to move to an open position from a closed position, wherein in a second nominal stroke the at least one movable contact is configured to move to the closed position from the open position, the method comprising:
in the closed position, activating by the electromagnetic drive or motor drive a first micromotion such that the at least one movable contact is configured to move from the closed position back to the closed position without moving to the open position;
in the open position, activating by the electromagnetic drive or motor drive a second micromotion such that the at least one movable contact is configured to move from the open position back to the open position without moving to the closed position; and
detecting by at least one sensor the first micromotion and the second micromotion, the at least one sensor comprising a position sensor, an acceleration sensor, an acoustic sensor, or a back e.m.f. sensor.

10. The method according to claim 9, wherein in the open position in activating the second micromotion, only a closing coil of a two-coil actuator is used, and
wherein at first the two-coil actuator is energised with positive current, and then the coil is energised with negative current to keep the at least one movable contact of the electromagnetic drive or the motor drive in the open position or to return it to the open position.

11. The method according to claim 9, wherein in the closed position in activating the first micromotion, only a closing coil of a two-coil actuator is used, a latch of the electromagnetic drive or a motor drive in the first micromotion being at first released by a negative current in the closing coil, and then the latch is re-established by a positive current, the positive current being larger in magnitude than the negative current.

* * * * *